(12) United States Patent
Huang

(10) Patent No.: US 11,197,371 B2
(45) Date of Patent: Dec. 7, 2021

(54) FLEXIBLE PRINTED CIRCUIT

(71) Applicant: Wuhan Tianma Micro-Electronics Co., Ltd., Wuhan (CN)

(72) Inventor: Xiang Huang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 32 days.

(21) Appl. No.: 16/834,690

(22) Filed: Mar. 30, 2020

(65) Prior Publication Data

US 2021/0185813 A1 Jun. 17, 2021

(30) Foreign Application Priority Data

Dec. 17, 2019 (CN) .......................... 201911303907.4

(51) Int. Cl.
*H05K 1/11* (2006.01)
*H05K 1/03* (2006.01)

(52) U.S. Cl.
CPC ........... *H05K 1/118* (2013.01); *H05K 1/0393* (2013.01); *H05K 1/115* (2013.01); *H05K 2201/09554* (2013.01)

(58) Field of Classification Search
CPC .... H05K 1/0225; H05K 1/0227; H05K 1/117; H05K 1/118; H05K 1/189; H05K 2201/09757; H05K 2201/09727; H05K 2201/09709; H05K 2201/0979; H05K 2201/0969; H05K 2201/09681; H05K 2201/09409; H05K 2201/09736; H05K 1/0393; H05K 1/115; H05K 1/112; H05K 2201/09554; H05K 2201/09445; H05K 2201/09236
See application file for complete search history.

(56) References Cited

U.S. PATENT DOCUMENTS

| 7,439,449 | B1 * | 10/2008 | Kumar | .................. G02B 6/4292 174/254 |
| 2006/0081960 | A1 * | 4/2006 | Wu | ........................ H01G 4/35 257/532 |
| 2016/0218079 | A1 | 7/2016 | Gong et al. | |

FOREIGN PATENT DOCUMENTS

CN 104020919 A 9/2014

* cited by examiner

Primary Examiner — Roshn K Varghese
(74) Attorney, Agent, or Firm — von Briesen & Roper, s.c.

(57) ABSTRACT

Provided is an FPC, including a first row of gold fingers and a second row of gold fingers disposed on a same layer, and multiple first connection lines. The first row of gold fingers includes multiple first gold fingers extending in a first direction and arranged in a second direction. The second row of gold fingers includes multiple second gold fingers extending in the first direction and arranged in the second direction. The multiple first connection lines are disposed in a different layer from the second row of gold fingers, electrically connected to the multiple first gold fingers, and insulated from the multiple second gold fingers and extend to an area where the second row of gold fingers is located. The first connection line includes a first wire and a second wire. The first wire includes a first portion, a second portion and a third portion connected in sequence.

14 Claims, 7 Drawing Sheets

FLEXIBLE PRINTED CIRCUIT

CROSS-REFERENCES TO RELATED APPLICATIONS

The present disclosure claims priority to a Chinese patent application No. 201911303907.4 filed on Dec. 17, 2019 to the CNIPA, the content of which is incorporated herein by reference in its entirety.

TECHNICAL FIELD

The present disclosure relates to the technical field of printed circuit boards and, in particular, to a flexible printed circuit (FPC).

BACKGROUND

An FPC has the characteristics of high degree of bending, high wire density, less thickness, and small quality, etc., and has been widely used in electronic products. A binding area consisting of many neatly arranged golden yellow conductive contact pads is arranged on the FPC. Since the golden yellow conductive contact pad looks like a golden finger, the golden yellow conductive contact pad is called "a gold finger" in the industry. The gold fingers are used for connection between printed circuit boards, may be connected to a circuit and may transmit a signal.

When the FPC is bound to a pad of a module, the gold fingers need to be bound to the pad by a conductive adhesive. For the FPC with double-row gold fingers, in order to ensure that conductive particles in the conductive adhesive are fully crushed during binding, and a good electric contact performance is achieved, the back of the gold fingers in the binding area needs to be as flat as possible. If the binding area of the FPC has a large undulation, uneven stress during binding is easily caused, such that conductive particles in certain areas cannot be crushed, the gold fingers cannot be fully electrically connected to the pad, and the yield is affected. Wires of the first row of gold fingers in the FPC with the double-row gold fingers need to extend to a connector via an area of the second row of gold fingers in the FPC with the double-row gold fingers, and wires below the second row of gold fingers may cause the unflatness of the binding area. In the related art, wiring on the back of the gold fingers is generally avoided, and the wiring is performed through a manner of winding the periphery of the area where the second row of the gold fingers is located, so as to ensure the flatness of the back of the gold fingers to the maximum extent. However, this needs to increase an appearance size of the product to meet the requirements on the wiring.

SUMMARY

The present disclosure provides an FPC to improve the flatness of the binding area of the double-row gold fingers, and improve the binding yield.

The present disclosure provides an FPC. The FPC includes a first row of gold fingers, a second row of gold fingers and multiple first connection lines. The first row and the second row are disposed on a same layer, the first row of gold fingers includes multiple first gold fingers extending in a first direction and arranged in a second direction, and the second row of gold fingers includes multiple second gold fingers extending in the first direction and arranged in the second direction. The multiple first connection lines are disposed in a different layer from the second row of gold fingers. The multiple first connection lines are electrically connected to the multiple first gold fingers, and the multiple first connection lines are insulated from the multiple second gold fingers and extend to an area where the second row of gold fingers is located. The first connection line includes a first wire and a second wire, and a line width of the first wire is greater than a line width of the second wire. The first wire includes a first portion, a second portion and a third portion connected in sequence, the second portion overlaps with the area where the second row of gold fingers is located, and the second portion includes multiple sub-wires connected in parallel.

In an embodiment, the first wire includes at least one of a ground line, a positive power signal line or a negative power signal line.

In an embodiment, a total resistance per unit length of the multiple sub-wires in the second portion is equal to a resistance per unit length of the first portion, and the resistance per unit length of the first portion is equal to a resistance per unit length of the third portion.

In an embodiment, in an extending direction perpendicular to the first connection line, a width of the first portion, a width of the second portion and a width of the third portion are equal. A thickness of the second portion is greater than a thickness of the first portion, and the thickness of the first portion is equal to a thickness of the third portion.

In an embodiment, a line spacing between adjacent sub-wires in the second portion is equal to a line spacing between adjacent first connection lines.

In an embodiment, a line width of the sub-wire is equal to the line width of the second wire.

In an embodiment, the FPC further includes a top metal layer, at least one intermediate metal layer and a bottom metal layer. The top metal layer is insulated from the intermediate metal layer adjacent to the top metal layer, two adjacent intermediate metal layers are insulated, and the bottom metal layer is insulated from the intermediate metal layer adjacent to the bottom metal layer. A side of the bottom metal layer facing away from the intermediate metal layer is provided with a first adhesive layer, and a side of the first adhesive layer facing away from the bottom metal layer is provided with a covering protective layer. The top metal layer includes the first row of gold fingers and the second row of gold fingers. At least one of the intermediate metal layer or the bottom metal layer includes the first connection line.

In an embodiment, an intermediate metal layer including the first connection line is an intermediate circuit layer, another intermediate metal layer is an intermediate shielding layer, and the intermediate shielding layer is a whole-surface metal layer. The intermediate shielding layer is located at least one of: between the top metal layer and the intermediate circuit layer, between adjacent intermediate circuit layers, or between the intermediate circuit layer and the bottom metal layer. A base material layer is provided between the top metal layer and the intermediate metal layer adjacent to the top metal layer. A hot-pressing curing layer is provided between the adjacent intermediate metal layers, and between the bottom metal layer and the intermediate metal layer adjacent to the bottom metal layer.

In an embodiment, the top metal layer includes multiple second connection lines. At least part of the multiple second connection lines are electrically connected to the second gold fingers, and the first gold fingers are electrically connected to the first connection lines through a via hole.

In an embodiment, a side of the covering protective layer facing away from the bottom metal layer is provided with an ink layer.

In an embodiment, a side surface of a metal layer including the first connection line facing away from the second row of gold fingers is provided with an ink layer, and the ink layer is filled in a gap between adjacent first connection lines.

In an embodiment, a side of the covering protective layer facing away from the bottom metal layer is provided with a second adhesive layer, and a side of the second adhesive layer facing away from the bottom metal layer is provided with a supporting film.

In an embodiment, a side surface of a metal layer including the first connection line facing away from the second row of gold fingers is provided with a hot-pressing curing layer, and the hot-pressing curing layer is filled in a gap between adjacent first connection lines.

In an embodiment, a side of a metal layer including the first connection line facing away from the second row of gold fingers is located on a supporting film.

In an embodiment, a thickness of the second portion is T1, and a thickness of the ink layer is T2, and T2≥(T1+10) um.

According to the technical schemes provided by the present disclosure, by disposing the first row of gold fingers and the second row of gold fingers on the same layer, the first gold fingers and the second gold fingers extending in the first direction and arranged in the second direction are formed, respectively. The multiple first connection lines disposed in a different layer from the second row of gold fingers are electrically connected to the first gold fingers, insulated from the second gold fingers, and extend to the area where the second row of gold fingers is located. The first connection line includes the first wire and the second wire. The line width of the first wire is greater than the line width of the second wire. The second portion of the first wire overlaps with the area where the second row of gold fingers is located. In the present disclosure, the second portion is arranged as multiple sub-wires connected in parallel, and a gap exists between adjacent sub-wires, so that a uniform adhesive filling effect can be achieved, a phenomenon that a higher protrusion is formed after the area where the first wire is located is covered by the adhesive or the prepreg and due to the relatively thicker line width of the first wire is avoided. Thus, the flatness of the binding area of the double-row gold finger is improved.

BRIEF DESCRIPTION OF DRAWINGS

In order to more clearly explain the technical schemes of the exemplary embodiments of the present disclosure, the drawings used for describing the embodiments will be briefly introduced below. Apparently, the drawings to be introduced are merely the drawings of part of the embodiments of the present disclosure to be described, rather than all embodiments of the present disclosure. For those skilled in the art, other drawings may also be obtained without the exercise of inventive faculty according to these drawings.

DETAILED DESCRIPTION

Figure 1:
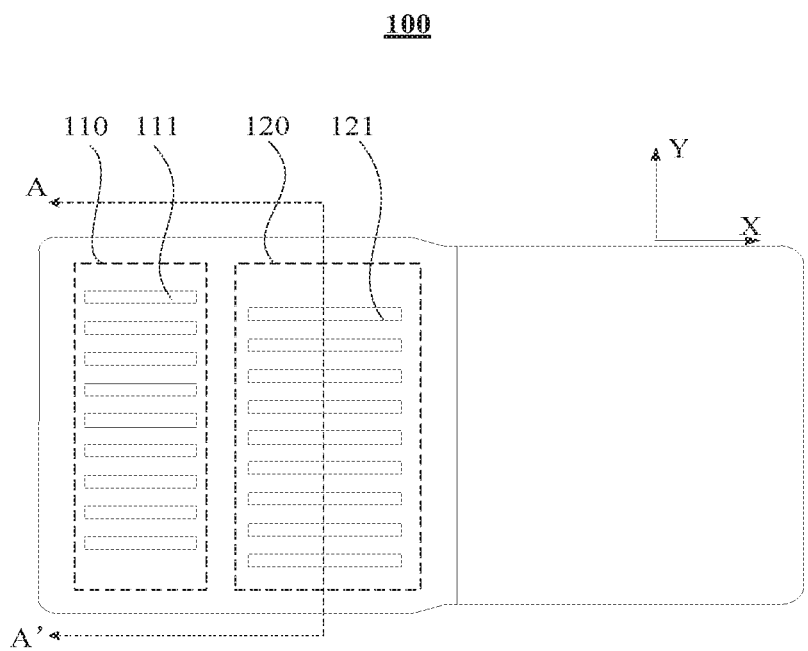
FIG. 1 is a top view of an FPC according to an embodiment of the present disclosure.

The present application will be further described in detail in conjunction with the drawings and embodiments below. It should be understood that the specific embodiments described herein are merely used for explaining the present application and are not intended to limit the present application. It should also be noted that, for ease of description, only some, but not all, of the structures related to the present application are shown in the drawings.

Figure 2:
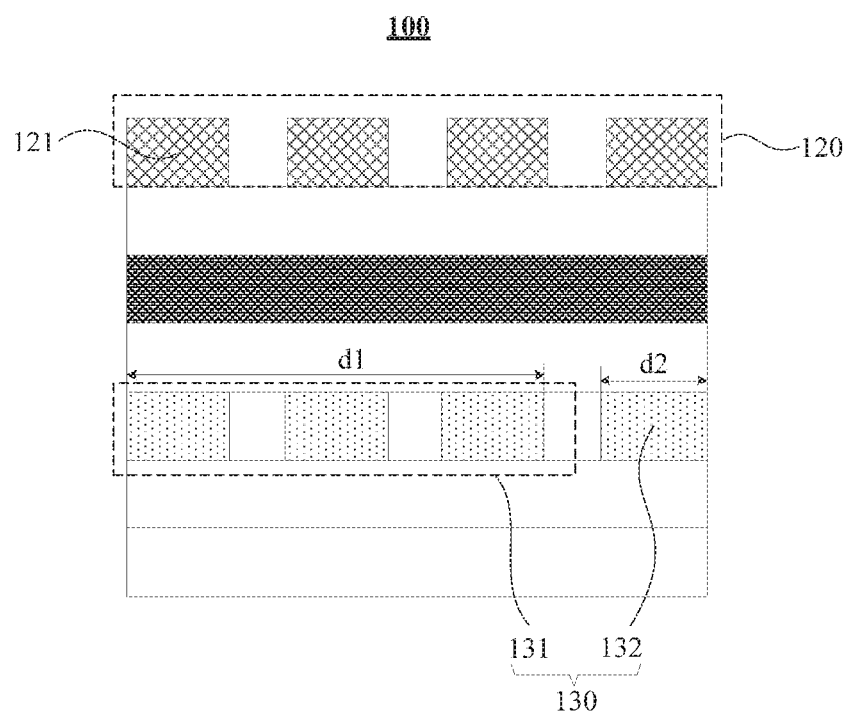
FIG. 2 is a cross-sectional view taken along AA' of the FPC shown in FIG. 1.
Figure 3:
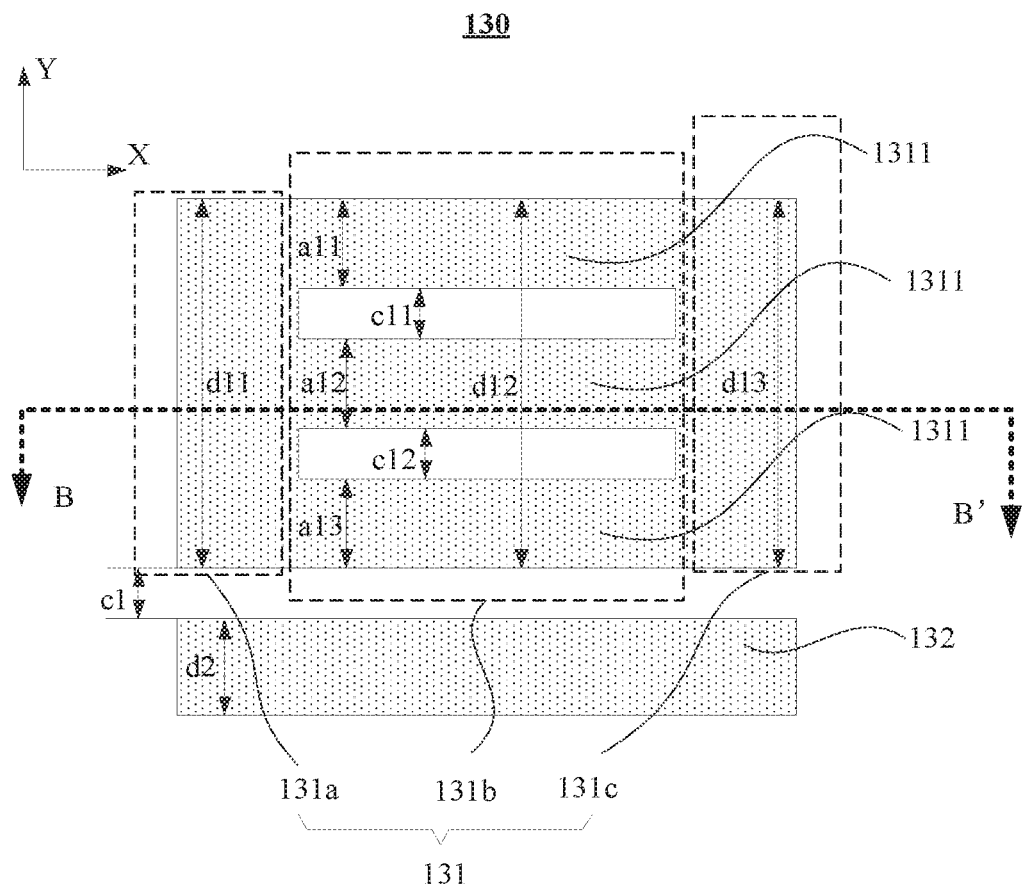
FIG. 3 is a partial top view of a first connection line of the FPC shown in FIG. 1.

FIG. 1 is a top view of an FPC according to an embodiment of the present disclosure, FIG. 2 is a cross-sectional view taken along AA' of the FPC shown in FIG. 1, and FIG. 3 is a partial top view of a first connection line of the FPC shown in FIG. 1. Referring to FIG. 1, FIG. 2 and FIG. 3, the FPC is a common electrical connection device in various electronic devices, and an end of the FPC is designed with gold fingers for connecting to a connector. The gold fingers are electrically connected to the connector through wires in the FPC, and the connector is electrically connected to components of the electronic device, such as a main board. In order to reduce the width of the FPC, the gold fingers are designed in two rows, and wires of a first row 110 of gold fingers closer to an end of the FPC need to be pulled out from an area where a second row 120 of gold fingers is located, and connected to the connector. The width of the FPC may be increased through a manner that the wires of the first row 110 of gold fingers are arranged between adjacent second gold fingers 121 in the second row 120 of gold fingers, which is not favorable for miniaturization of the device. Therefore, part of the wires electrically connected to first gold fingers 111 in the first row 110 of gold fingers are disposed below the film layer where the second gold fingers 121 are located.

The FPC 100 provided in the embodiment of the present disclosure includes the first row 110 of gold fingers, the second row 120 of gold fingers and multiple first connection lines 130. The first row 110 and the second row 120 are disposed on the same layer. The first row 110 of gold fingers includes multiple first gold fingers 111 extending in a first direction and arranged in a second direction, and the second row 120 of gold fingers includes multiple second gold fingers 121 extending in the first direction and arranged in the second direction. The multiple first connection lines 130 are disposed in a different layer from the second row 120 of gold fingers.

The multiple first connection lines 130 are electrically connected to the multiple first gold fingers 111, which is not shown in the Figures. The multiple first connection lines 130 are insulated from the multiple second gold fingers 121 and extend to the area where the second row 120 of gold fingers is located. As shown in FIG. 1, the first row 110 of gold fingers includes multiple first gold fingers 111, each of the multiple first gold fingers 111 extends in a X direction, and the multiple first gold fingers 111 in the first row 110 of gold fingers are arranged in a Y direction. The second row 120 of gold fingers includes multiple second gold fingers 121, each of the multiple second gold fingers 121 extends in the X direction, and the multiple second gold fingers 121 in the second row of gold fingers 120 are arranged in the Y direction. The multiple first connection lines 130 and the second row 120 of gold fingers are disposed in different layers. The multiple first connection lines 130 are insulated from the second gold fingers 121 and extend to the area corresponding to the second row 120 of gold fingers. The multiple first connection lines 130 and the first row 110 of gold fingers are disposed in different layers, but the multiple first connection lines 130 are electrically connected to the multiple first gold fingers 111, thus forming double-row gold fingers.

Referring to FIG. 2, the first connection line 130 includes a first wire 131 and a second wire 132. A line width d1 of the first wire 131 is greater than a line width d2 of the second wire 132. Referring to FIG. 3, the first wire 131 includes a first portion 131a, a second portion 131b and a third portion 131c connected in sequence, the second portion 131b overlaps with the area where the second row 120 of gold fingers is located, and the second portion 131b includes multiple sub-wires 1311 connected in parallel. Compared with the related art, in order to ensure the flatness of the binding area of the double-row gold fingers, wires are not disposed in the area where the second row of gold fingers is located, and a manner of winding the periphery of the area where the second row of gold fingers is located is adopted. In the embodiment of the present disclosure, a thicker portion of the first wire 131 (i.e., the second portion 131b of the first wire 131) overlapping with the area where the second row 120 of gold fingers is located is arranged as the multiple sub-wires 1311 connected in parallel. As shown in FIG. 3, a right side of the first portion 131a of the first wire 131 is connected to a left side of the second portion 131b, and a right side of the second portion 131b is connected to a left side of the third portion 131c, that is, the first portion 131a, the second portion 131b and the third portion 131c are connected in series with each other to form the first wire 131. The second portion 131b of the first wire 131 is formed by the multiple sub-wires 1311 connected in parallel. A certain gap exists between adjacent sub-wires 1311.

Figure 4:
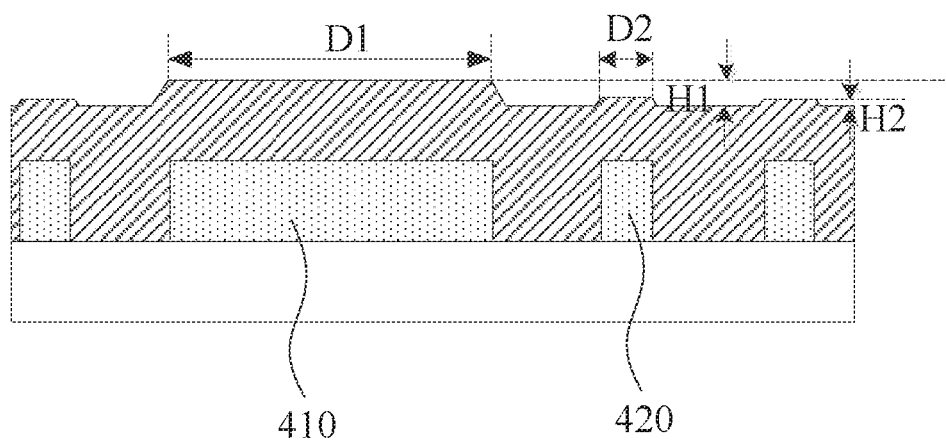
FIG. 4 is a partial cross-sectional view taken along AA' of an area where wires overlap with gold fingers according to the related art.

FIG. 4 is a partial cross-sectional view taken along AA' of an area where wires overlap with gold fingers according to the related art. Referring to FIG. 4, an area overlapping with the gold fingers is provided with both a thicker wire 410 and thinner wires 420. After the wires are coated with an adhesive or covered with a prepreg, since the area occupied by the thicker wire 410 is large and the adhesive above the thicker wire 410 is not easy to flow into gaps among the wires, there is a possibility that a higher protrusion is formed above the thicker wire 410. In addition, since a line width of the thicker wire 410 is large, heights of the protrusions formed above the thinner wire 420 and the thicker wire 410 are different. As shown in FIG. 4, a height H1 of the protrusion above the thicker wire 410 is greater than a height H2 of the protrusion above the thinner wire 420, and a width D1 of the protrusion above the thicker wire 410 is also much greater than a width D21 of the protrusion above the thinner wire 420. As a result, a surface of the binding area has a large undulation, and the surface of the binding area is uneven. When the gold fingers are bound to a pad, and the conductive adhesive between the gold finger and the pad is pressed, the pressure of pressing the conductive adhesive on the areas with different undulation degrees is different, so that conductive particles in the conductive adhesive can not be sufficiently crushed due to insufficient pressure in some areas, which affects the binding effect and yield of the module.

Figure 5:
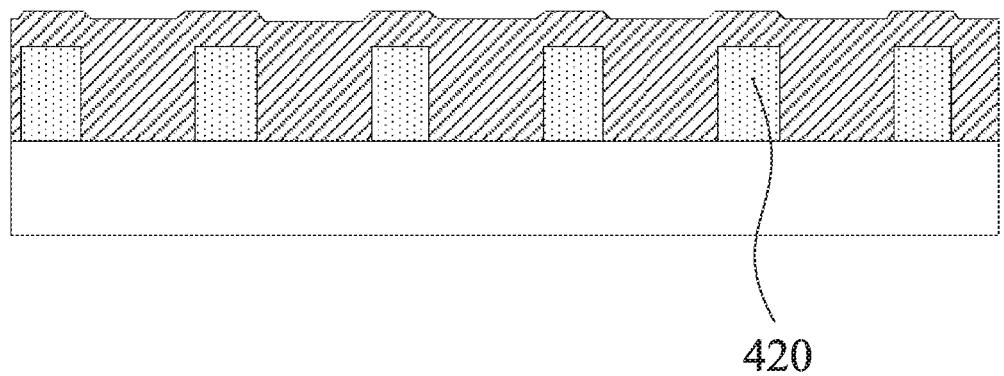
FIG. 5 is a partial cross-sectional view taken along AA' of an area where wires overlap with gold fingers according to an embodiment of the present disclosure.

FIG. 5 is a partial cross-sectional view taken along AA' of an area where wires overlap with gold fingers according to an embodiment of the present disclosure. Referring to FIG. 5, the area overlapping with the gold fingers is only provided with the thinner wires 420. After the wires are coated with the adhesive or covered with the prepreg, heights of the protrusions formed above all the thinner wires 420 are similar, and line widths of the protrusions above all the thinner wires 420 are also similar. Therefore, the surface of the binding area has a small undulation, the protrusions are evenly distributed, and the surface of the binding area has a high flatness. Therefore, when the golden fingers are bound to the pad, and the conductive adhesive between the golden finger and the pad is pressed, the pressure of pressing the conductive adhesive are similar, the application of enough pressure enables the conductive particles in the conductive adhesive to be sufficiently crushed, so that a good electrical contact performance is achieved and the binding yield is improved. In the embodiment of the present disclosure, in conjunction with FIG. 2 and FIG. 3, the thicker second portion 131b of the first connection line 131 overlapping with the area where the second gold fingers 121 are located is arranged as the multiple sub-wires 1311 connected in parallel, so as to balance the line width of each wire below the second row 120 of gold fingers and ensure uniform adhesive filling. Since a gap exists between adjacent sub-wires 1311, after the wires are coated with the adhesive or covered with the prepreg, a gap between the first wire and the second wire 132 is filled, and the gap between the adjacent sub-wires in the second portion 131b is filled, thus a flatter surface is formed in the binding area. Therefore, the flatness of the binding area of the double-row gold fingers and the binding yield are improved.

The FPC provided in the embodiment of the present disclosure does not need to adopt a manner of winding the periphery of the second gold fingers like the related art, but adopts a manner of extending the first connection lines connected to the first gold fingers to the area where the second gold fingers are located. Therefore, the size of the FPC does not need to be changed. In addition, the thicker second portion of the first connection line overlapping with the area where the second gold fingers 121 are located is arranged as the multiple sub-wires connected in parallel. Because the gap exists between the adjacent sub-wires, the function of uniform adhesive filling can be achieved, and a phenomenon that a higher protrusion is formed after the area where the first wire is located is covered by the adhesive or the prepreg and due to the relatively thicker line width of the first wire is avoided. Thus, according to the embodiment of the present disclosure, the flatness of the binding area of the double-row golden fingers can be improved.

In an embodiment, the first wire 131 includes at least one of a ground line, a positive power signal line or a negative power signal line. For an FPC providing electrical signal transmission for a display panel, the ground line, the positive power signal line and the negative power signal line are relatively thick, and a clock signal line transmitting a clock signal is relatively thin. The positive power signal line and the negative power signal line are used for transmitting a power signal to the display panel, the ground signal line is used for providing a ground potential for the display panel, and each clock signal line is used for transmitting the clock signal to the display panel, such as transmitting the clock signal to a gate driver of the display panel. In the related art, a line width of the positive power signal line and a line width of the negative power signal line may be 0.4 mm-0.6 mm, a line width of the ground line may be 0.2 mm, and a line width of the clock signal line may be about 0.06 mm. The portions of the thicker ground line, the thicker positive power signal line and the thicker negative power signal line overlapping with the area where the second row 120 of gold fingers is located are arranged as multiple thinner sub-wires connected in parallel.

In an embodiment, continuing to refer to FIG. 3, a total resistance per unit length of the multiple sub-wires 1311 in the second portion 131b is equal to a resistance per unit length of the first portion 131a, and the resistance per unit length of the first portion 131a is equal to a resistance per unit length of the third portion 131c.

In the embodiment of the present disclosure, in order to prevent the resistance of each area of the first wire 131 from being changed due to the parallel connection of the multiple sub-wires 1311, the total resistance per unit length of the multiple sub-wires 1311 in the second portion 131b is arranged to be equal to the resistance per unit length of the first portion 131a, and the resistance per unit length of the first portion 131a is arranged to be equal to the resistance per unit length of the third portion 131c. As shown in FIG. 3, if only part of the second portion 131b is excavated to form the multiple sub-wires 1311, and the multiple sub-wires 1311 are connected in series with the first portion 131a and the third portion 131c after connected in parallel, a resistance of the second portion 131b certainly be less than the resistances of the first portion 131a and the third portion 131c. Therefore, the resistance of each area of the first wire 131 is different, which affects the transmitted signals to a certain extent. Therefore, in the embodiment of the present disclosure, the total resistance per unit length of the multiple sub-wires 1311 in the second portion 131b is arranged to be equal to the resistance per unit length of the first portion 131a, and the resistance per unit length of the first portion 131a is arranged to be equal to the resistance per unit length of the third portion 131c, so as to achieve a resistance equalization in the areas of the first wire 131.

As shown in FIG. 3, exemplarily, the second portion 131b is formed by three sub-wires 1311 connected in parallel, and a total resistance R2 per unit length of the three sub-wires 1311 in the second portion 131b satisfies a formula (1).

$$1/R2=1/R21+1/R22+1/R23 \qquad (1)$$

R21 is a resistance per unit length of the first sub-wire 1311, R22 is a resistance per unit length of the second sub-wire 1311, and R23 is a resistance per unit length of the third sub-wire 1311. The total resistance R2 per unit length of the multiple sub-wires 1311 in the second portion 131b is equal to the resistance R1 per unit length of the first portion 131a, and the resistance R1 per unit length of the first portion 131a is equal to the resistance R3 per unit length of the third portion 131c, that is, R2=R1=R3.

In the embodiment of the present disclosure, a number N of sub-wires 1311 may be connected in parallel to form the second portion 131b. In the embodiment of the present disclosure, the number of sub-wires in the second portion 131b is not specifically limited.

Figure 6:
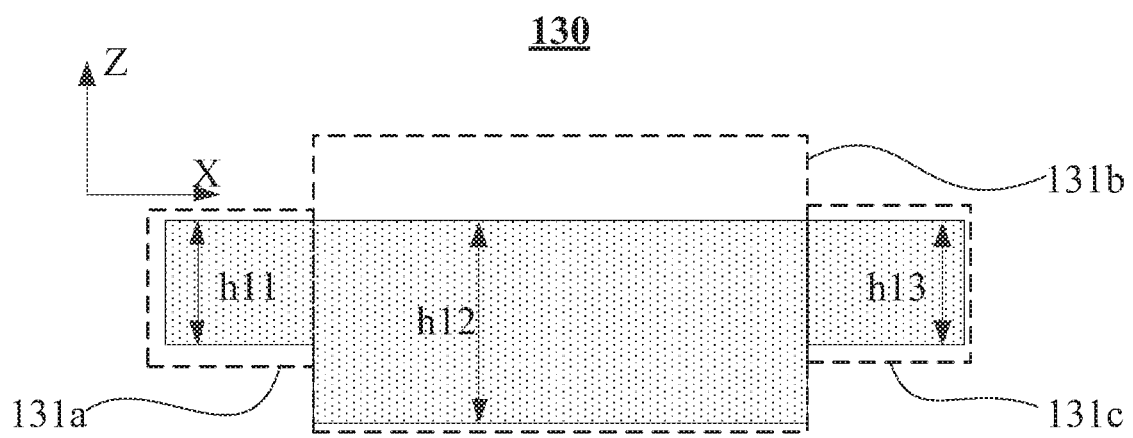
FIG. 6 is a cross-sectional view taken along BB' of the first connection line shown in FIG. 3.

In an embodiment, continuing to refer to FIG. 3, in the extending direction perpendicular to the first connection line 130, the width of the first portion 131a, the width of the second portion 131b and the width of the third portion 131c are equal, that is, in the Y direction in the FIG. 3, the width of the first portion 131a, the width of the second portion 131b and the width of the third portion 131c are equal, d11=d12=d13, and an external contour of the first connection line 130 is not changed. FIG. 6 is a cross-sectional view taken along BB' of the first connection line 130 shown in FIG. 3. In order to avoid the resistance of the second portion 131b from decreasing due to the partial wire of the second portion 131b being excavated, a thickness h12 of the second portion 131b may be set to be larger than a thickness h11 of the first portion 131a, and the thickness h11 of the first portion 131a may be set to be equal to a thickness h13 of the third portion 131c.

Exemplarily, the second portion 131b is formed by three sub-wires 1311 connected in parallel. As shown in FIG. 3, a resistance R per unit length satisfies a following formula: R=ρ/S, where ρ is resistivity, the resistivity of the same material is the same, and S is a cross-sectional area of a wire. When the materials of the first portion 131a, the second portion 131b and the third portion 131c are the same, a cross-sectional area S1 of the first portion 131a, a cross-sectional area S2 of the second portion 131b, and a cross-sectional area S3 of the third portion 131c are required to be equal, that is, S1=S2=S3. The cross-sectional area is equal to the product of the line width and the thickness, therefore S2 satisfies a formula (2).

$$S2=S21+S22+S23=h12*(a11+a12+a13) \qquad (2)$$

S21 is a cross-sectional area of the first sub-wire 1311, S22 is a cross-sectional area of the second sub-wire 1311, S23 is a cross-sectional area of the third sub-wire 1311, h12 is the thickness of the second portion 131b, a11 is the line width of the first sub-wire 1311, a12 is the line width of the second sub-wire 1311, and a13 is the line width of the third sub-wire 1311. A gap exists between the adjacent sub-wires 1311, thus the sum of the line widths of the three sub-wires 1311 is less than the line width of the first portion 131a, that is, the line width of the second portion 131b is less than the line width of the first portion 131a.

In the extending direction perpendicular to the first connection line 130, i.e., in the Y direction in the FIG. 3, the width of the first portion 131a, the width of the second portion 131b and the width of the third portion 131c are equal, that is, d11=d12=d13. In this way, the thickness of the second portion 131b may be set to be greater than the thickness of the first portion 131a, and the thickness of the first portion 131a may be set to be equal to the thickness of the third portion 131c, that is, h12>h11, and h11=h13. The above conditions are satisfied, such that the total resistance per unit length along the multiple sub-wires 1311 in the second portion 131b is equal to the resistance per unit length of the first portion 131a.

In an embodiment, with continued reference to FIG. 3, a line spacing between the adjacent sub-wires 1311 in the second portion 131b is equal to a line spacing between adjacent first connection lines 130.

In an embodiment, as shown in FIG. 3, a line spacing between the first sub-wire 1311 and the second sub-wire 1311 is c11, a line spacing between the second sub-wire 1311 and the third sub-wire 1311 is c12, the line spacing between the adjacent first connection lines 130 is c1, and c11=c12=c1. The line spacing between the adjacent first connection lines 130 may be, for example, a line spacing between the first wire 131 and the second wire 132, a line spacing between two adjacent first wires 131 or a line spacing between two adjacent second wires 132, that is, a line spacing between the wires in the area where the second portion 131 is located to be equal. On the surface of the binding area, since the distance between two adjacent protrusions formed by the wires are equal, the distribution of protrusions on the surface of the binding area is more uniform, which can improve the binding yield.

In an embodiment, continuing to refer to FIG. 3, the line width of the sub-wire 1311 is equal to the line width of the second wire 132. Exemplarily, a line width a1 of the first sub-wire 1311, a line width a2 of the second sub-wire 1311 and a line width a3 of the third sub-wire 1311 are equal, that is, a1=a2=a3. The line width of the second wire 132 is d2, and d2 satisfies a following formula: d2=a1=a2=a3. The line widths of all the wires in the area where the second gold fingers 121 are located are evenly set. On the surface of the binding area, the line width of the protrusions formed by the wire are almost the same, namely, the undulations on the surface of the binding area are almost the same, so that the flatness of the surface of the binding area of the double-row gold fingers and the binding yield are improved.

Figure 7:
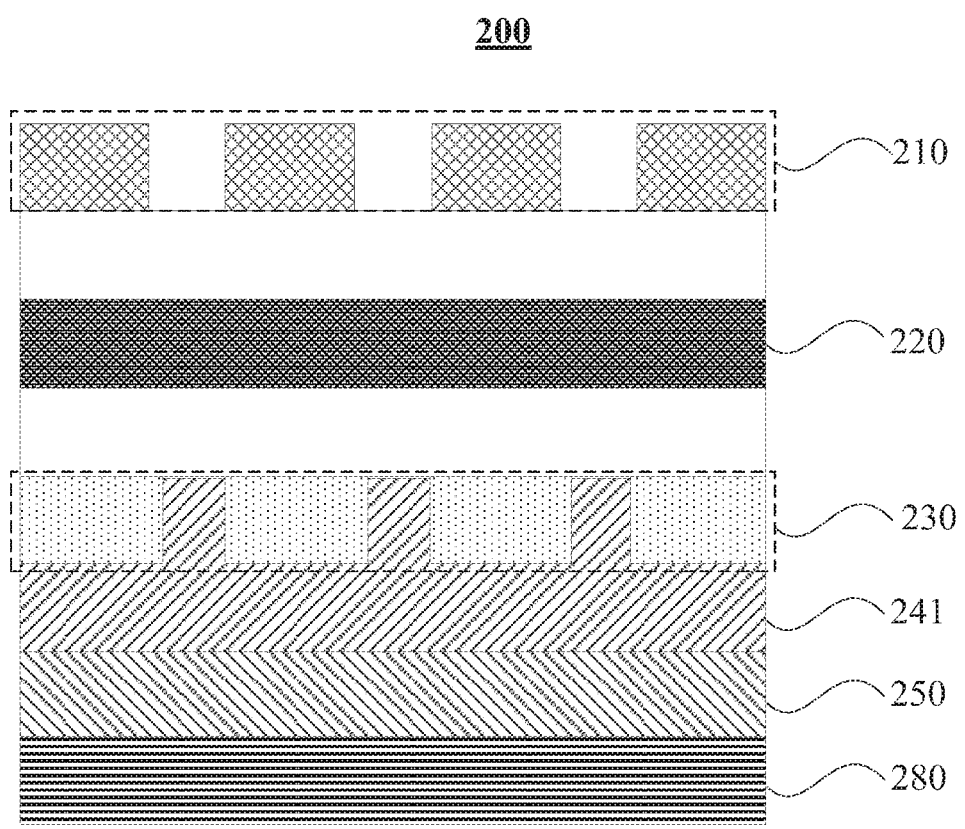
FIG. 7 is a cross-sectional view taken along AA' of another FPC according to an embodiment of the present disclosure.

FIG. 7 is a cross-sectional view taken along AA' of another FPC according to an embodiment of the present disclosure. As shown in FIG. 7, an FPC 200 includes a top metal layer 210, at least one intermediate metal layer 220 and a bottom metal layer 230. The top metal layer 210 is insulated from the intermediate metal layer 220, two adjacent intermediate metal layers 220 are insulated, and the bottom metal layer 230 is insulated from the intermediate metal layer 220. A side of the bottom metal layer 230 facing away from the intermediate metal layer 220 is provided with a first adhesive layer 241, and a side of the first adhesive layer 241 facing away from the bottom metal layer 230 is provided with a covering protective layer 250. The top metal layer 210 includes the first row 110 of gold fingers and the second row 120 of gold fingers. At least one of the intermediate metal layer 220 or the bottom metal layer 230 includes the first connection line 130.

Exemplarily, as shown in FIG. 7, the FPC 200 includes one intermediate metal layer 220, a first insulating layer is provided between the top metal layer 210 and the intermediate metal layer 220, such that the top metal layer 210 is insulated from the intermediate metal layer 220. A second insulating layer is provided between the intermediate metal layer 220 and the bottom metal layer 230, such that the intermediate metal layer 220 is insulated from the bottom metal layer 230. The bottom metal layer 230 includes the first connection line 130.

The first adhesive layer 241 is mainly used for filling the gap in the first connection line 130, and forms a flatter surface on a side of the bottom metal layer 230 facing away from the top metal layer 210. Meanwhile, the first adhesive layer 241 is also used for fixing the covering protective layer 250 on a side of the bottom metal layer 230 facing away from the top metal layer 210. The covering protective layer 250 is generally made of the same material as a base material layer, bound on a side of the bottom metal layer 230 facing away from the top metal layer 210 through the first adhesive layer 241, mainly functions to protect the FPC, and prevents damage to a surface of the FPC 200 during binding. In addition, the covering protective layer 250 further reduces the unflatness on the surface of the binding area of the double-row gold fingers, so that the flatness of the binding area of the fingers and the binding yield are improved.

In the embodiment of the present disclosure, the at least one intermediate metal layer 220 in the FPC 200 may also be two or more layers, which is not specifically limited. However, two adjacent intermediate metal layers 220 need to be insulated from each other. In addition, one or more layers of the intermediate metal layers 220 in the FPC 200 may further include the first connection line 130, which is not specifically limited.

Optionally, with continued reference to FIG. 7, a side of the covering protective layer 250 facing away from the bottom metal layer 230 is provided with an ink layer 280.

In the embodiment of the present disclosure, the side of the covering protective layer 250 facing away from the bottom metal layer 230 is provided with the ink layer 280. After the ink layer 280 is coated on the covering protective layer 250, ink in the ink layer 280 has fluidity and may fill a concave portion of a surface of the covering protective layer 250, such that the binding area of the double-row gold fingers forms a relatively flat surface, the unflatness of the surface caused by arranging the wires in the area where the second row 120 of gold fingers is located is further reduced, and the flatness of the binding area of the double-row gold fingers and the binding yield are improved.

Figure 8:
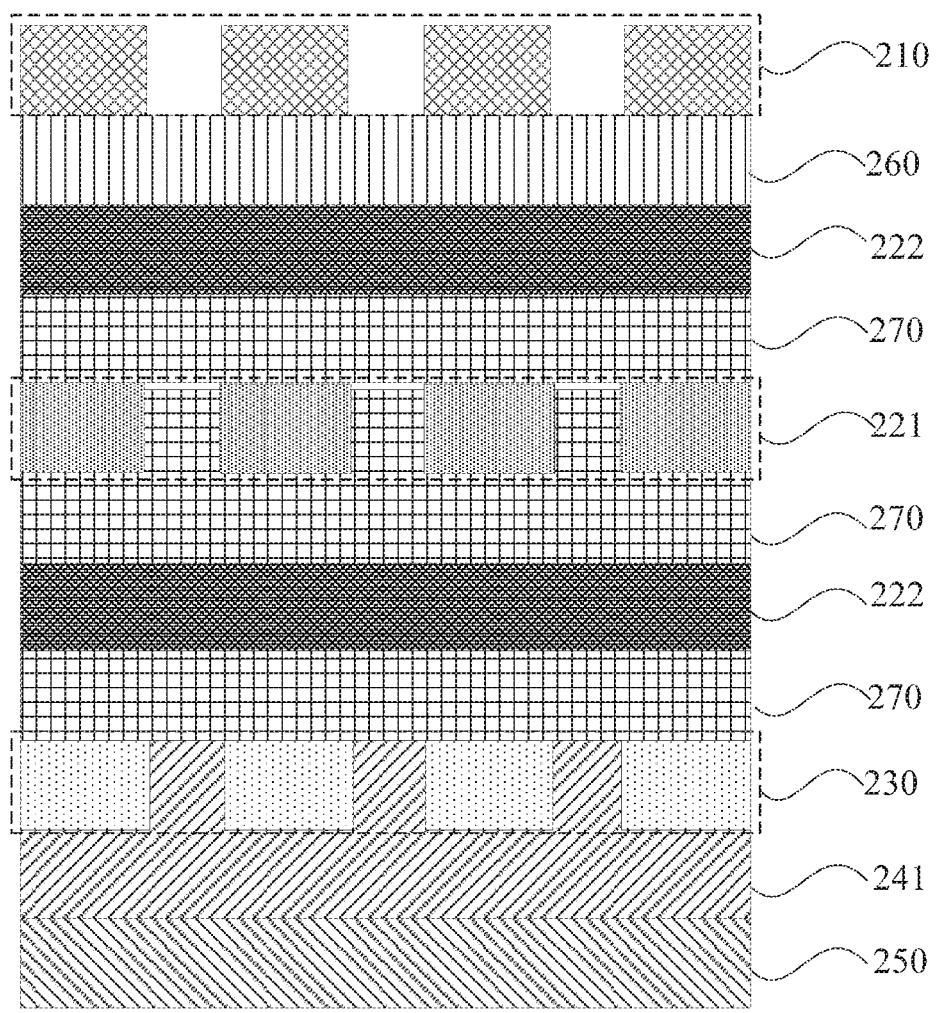
FIG. 8 is a cross-sectional view taken along AA' of another FPC according to an embodiment of the present disclosure.

FIG. 8 is a cross-sectional view taken along AA' of another FPC according to an embodiment of the present disclosure. As shown in FIG. 8, the intermediate metal layer 220 including the first connection line 130 is an intermediate circuit layer 221, another intermediate metal layers 220 is an intermediate shielding layers 222, and the intermediate shielding layer 222 is a whole-surface metal layer.

The intermediate shielding layer 222 is located at least one of: between the top metal layer 210 and the intermediate circuit layer 221, between adjacent intermediate circuit layers 221, or between the intermediate circuit layer 221 and a bottom metal layer 230.

A base material layer 260 is provided between the top metal layer 210 and the intermediate metal layer 220.

A hot-pressing curing layer 270 is provided between adjacent intermediate metal layers 220, and between the bottom metal layer 230 and the intermediate metal layer 220.

Exemplarily, as shown in FIG. 8, the intermediate metal layer 220 includes the intermediate circuit layer 221, a first intermediate shielding layer 222 and a second intermediate shielding layer 222. The first intermediate shielding layer 222 and the second intermediate shielding layer 222 are integral metal layers. The first intermediate shielding layer 222 is located between the top metal layer 210 and the intermediate circuit layer 221, and is used for preventing a signal in the top metal layer 210 from being transmitted to the intermediate circuit layer 221 and for preventing a signal in the intermediate circuit layer 221 from being transmitted to the top metal layer 210, so as to avoid the signal in the top metal layer 210 and the signal in the intermediate circuit layer 221 from mutual crosstalk. The second intermediate shielding layer 222 is located between the intermediate circuit layer 221 and the bottom metal layer 230 to prevent the signal in the intermediate circuit layer 221 and the signal in the bottom metal layer 230 from the mutual crosstalk. The intermediate shielding layer 222 may be an integral copper layer to reduce the crosstalk between inter-layer signals and ensure the quality of the signal.

A first hot-pressing curing layer 270 is disposed between the first intermediate shielding layer 222 and the intermediate circuit layer 221, and connects the first intermediate shielding layer 222 and the intermediate circuit layer 221. A second hot-pressing curing layer 270 is disposed between the intermediate circuit layer 221 and the second intermediate shielding layer 222, the intermediate circuit layer 221 includes the first connection line 130, the second hot-pressing curing layer 270 may fill a gap in the first connection line 130 and form a relatively flat surface on a side facing away from the top metal layer 210, and the second heat-pressing curing layer 270 is also used for connecting the intermediate circuit layer 221 and the second intermediate shield layer 222. A third heat-pressing curing layer 270 is disposed between the second intermediate shield layer 222 and the bottom metal layer 230, and connects the third intermediate shielding layer 222 and the bottom metal layer 230. The first intermediate shielding layer 222 is electrically insulated from the intermediate circuit layer 221, the intermediate circuit layer 221 is electrically insulated from the second intermediate shielding layer 222, and the second intermediate shielding layer 222 is electrically insulated from the bottom metal layer 230. Therefore, the hot-pressing curing layer 270 also functions as an insulation layer to electrically insulate the first intermediate shielding layer 222 from the intermediate circuit layer 221, electrically insulate the intermediate circuit layer 221 from the second intermediate shielding layer 222, and electrically insulate the second intermediate shielding layer 222 from the bottom metal layer 230. The bottom metal layer 230 also includes the first connection line 130. The first adhesive layer 241 is used for filling the gap in the first connection line 130 in addition to fixing the covering protective layer 250 on the side of the bottom metal layer 230 facing away from the top metal layer 210, and forms a relatively flat surface on the side of the bottom metal layer 230 facing away from the top metal layer 210, thereby improving the flatness of the binding area of the double-row gold fingers and the binding yield.

In the embodiment of the present disclosure, the intermediate metal layer 220 may further include multiple intermediate circuit layers 221 and multiple shielding layers 222, the hot-pressing curing layer 270 is provided between adjacent shielding layers 222, between adjacent intermediate circuit layers 221, and between the intermediate circuit layer 221 and the shielding layer 222.

In an embodiment, the top metal layer 210 includes multiple second connection lines, at least part of the second connection lines are electrically connected to the second gold fingers, and the first gold fingers are electrically connected to the first connection lines through a via hole.

In an embodiment, the top metal layer 210 includes the first row of gold fingers and the second row of gold fingers. The first connection lines are disposed on the intermediate metal layer 220 or the bottom metal layer 230. The top metal layer 210 is electrically insulated from the intermediate metal layer 220 and the bottom metal layer 230, therefore the first gold fingers 111 in the first row 110 of gold fingers may only be electrically connected to the first connection lines 130 through the via hole. The second gold fingers 121 in the second row 120 of gold fingers are electrically connected to the second connection lines in the top metal layer 210, the first row 110 of gold fingers is electrically insulated from the second row 120 of gold fingers, and a signal in the first row 110 of gold fingers and a signal in the second row 120 of gold fingers do not cause signal crosstalk. At the same time, the second connection lines are disposed on the top metal layer 210, and the top metal layer 210 may also be fully used for wiring, so as to reduce the thickness of the FPC 200 and make the process more convenient.

Figure 9:
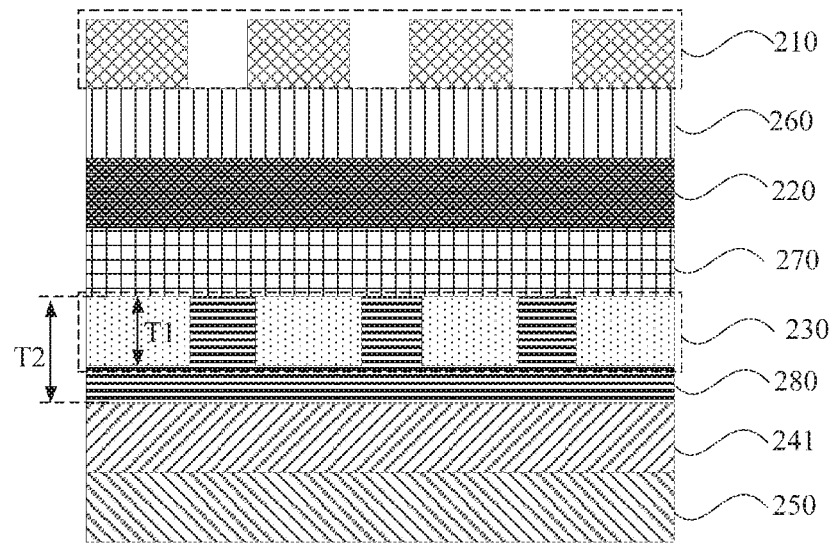
FIG. 9 is a cross-sectional view taken along AA' of another FPC according to an embodiment of the present disclosure.

FIG. 9 is a cross-sectional view taken along AA' of another FPC according to an embodiment of the present disclosure. As shown in FIG. 9, in the FPC 200, a side surface of a metal layer including the first connection line 130 facing away from the second row 120 of gold fingers is provided with the ink layer 280; and the ink layer 280 is filled in the gap between adjacent first connection lines 130.

In an embodiment, the metal layer including the first connection line 130 is the bottom metal layer 230. As shown in FIG. 9, the ink layer 280 is directly coated on a side surface of the bottom metal layer 230 facing away from the second row 120 of gold fingers. Gap areas in the first connection lines 130 is filled with the ink layer 280, and a relatively flat surface is formed on a side of the ink layer 280 facing away from the bottom metal layer 230, so that the unflatness on the surface of the binding area is reduced and the binding yield is improved. If the metal layer including the first connection line 130 further includes the intermediate metal layer 220, the ink layer 280 is further disposed on a side of the intermediate metal layer 220 facing away from the top metal layer 210, that is, the ink layer 280 is disposed between the intermediate metal layer 220 and the bottom metal layer 230, the ink layer 280 further functions as an insulating layer at this time. The ink layer 280 with a certain thickness needs to be disposed between a surface on a side of the intermediate metal layer 220 facing away from the top metal layer 210 and a side surface of the bottom metal layer 230 facing towards the top metal layer 210, so that the intermediate metal layer 220 is electrically insulated from the bottom metal layer 230. In addition, the first adhesive layer 241 and the protective cover layer 250 are finally formed, so that the flatness of the binding area of the double-row gold fingers and the binding yield are improved.

In an embodiment, continuing to refer to FIG. 9, the thickness of the second portion is T1, and the thickness of the ink layer 280 is T2, and $T2 \geq (T1+10)$ um.

In an embodiment, as shown in FIG. 9, the metal layer including the first connection line 130 is the bottom metal layer 230. The ink layer 280 is directly coated on the first connection line 130. The ink on the ink layer 280 flows into the gap in the first connection line 130 due to its fluidity. In order to ensure that a side surface of the ink layer 280 facing away from the bottom metal layer 230 is relatively flat, the ink layer 280 needs to completely fill the gap in the first connection line 130. Therefore, the thickness T2 of the ink layer 280 may not be less than the thickness T1 of the second portion. In addition to completely filling the gap in the first connection line 130, the ink layer 280 also forms a flat surface on a side of the bottom metal layer 230 facing away from the top metal layer 210. Therefore, after the ink layer 280 is filled in the gap in the first connection line 130, it is necessary to ensure that the ink layer 280 has a certain thickness to form a film layer with a flat surface. At the same time, when the metal layer including the first connection line 130 also includes the intermediate metal layer 220, the ink layer 280 needs to maintain a certain thickness to electrically insulate the intermediate metal layer 220 from the bottom metal layer 230. Therefore, the thickness T2 of the ink layer 280 needs to satisfy: $T2 \geq (T1+10)$ um.

Figure 10:
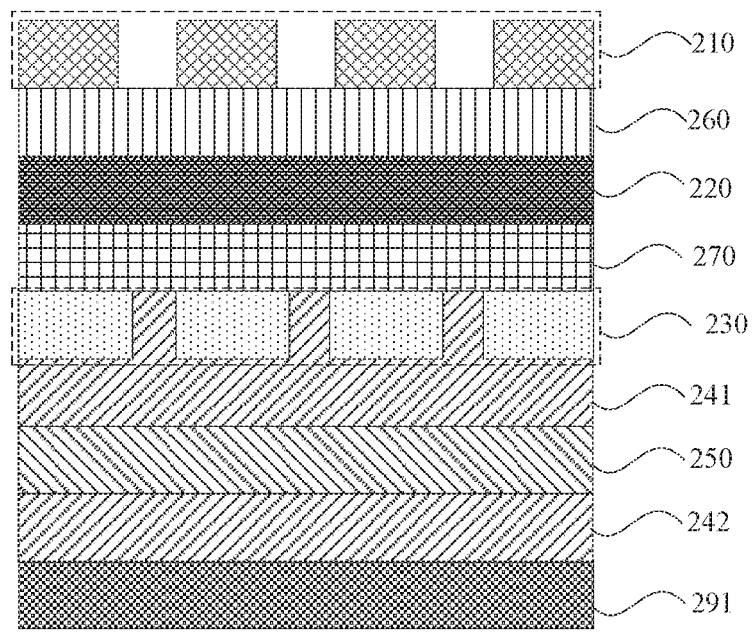
FIG. 10 is a cross-sectional view taken along AA' of another FPC according to an embodiment of the present disclosure.

FIG. 10 is a cross-sectional view taken along AA' of another FPC according to an embodiment of the present disclosure. As shown in FIG. 10, in the FPC 200, a side of the covering protective layer 250 facing away from the bottom metal layer 230 is provided with a second adhesive layer 242, and a side of the second adhesive layer 242 facing away from the bottom metal layer 230 is provided with a supporting film 291.

In an embodiment, the supporting film 291 is a film layer made of a hard material added in the partial area of the FPC in order to strengthen a bearing element area and facilitate installation. The main material is polyimide (PI), polyethylene terephthalate (PET), aluminum sheet, and steel sheet, etc. In the embodiment of the present disclosure, the supporting film 291 is adhered to a side of the covering protective layer 250 facing away from the covering protective layer 250 through the second adhesive layer 242, so as to strengthen the support of the bearing element area of the FPC, and at the same time, the support film 291 further improves the flatness of the binding area of the double-row gold fingers and the binding yield.

Figure 11:
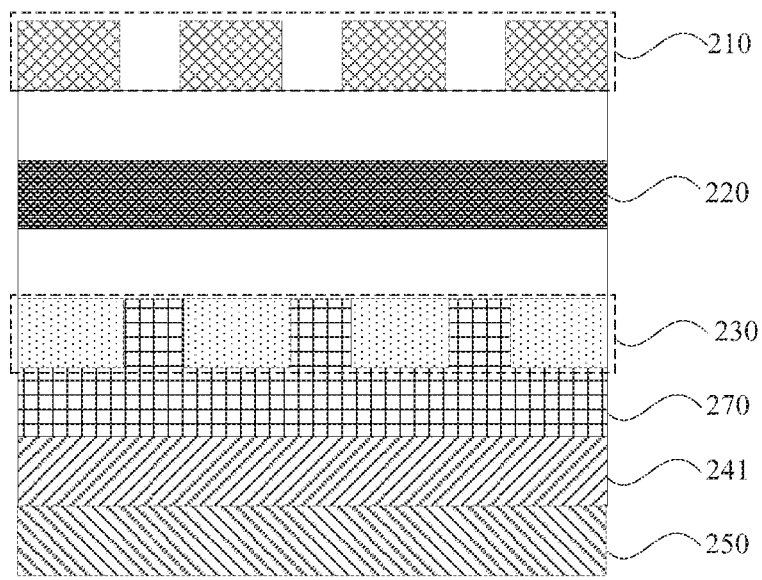
FIG. 11 is a cross-sectional view taken along AA' of another FPC according to an embodiment of the present disclosure.

FIG. 11 is a cross-sectional view taken along AA' of another FPC according to an embodiment of the present disclosure. As shown in FIG. 11, in the FPC 200, a side surface of the metal layer including the first connection line 130 facing away from the second row 120 of gold fingers is provided with the hot-pressing curing layer 270, and the hot-pressing curing layer 270 is filled in a gap between the adjacent first connection lines 130.

In an embodiment, the metal layer including the first connection line 130 is the bottom metal layer 230. As shown in FIG. 11, the hot-pressing curing layer 270 is disposed on a side surface of the bottom metal layer 230 facing away from the second row 120 of gold fingers, and the hot-pressing curing layer 270, after being hot pressed, is fully filled in the gap between the adjacent first connection lines 130, so that the surface formed on the side of the hot pressing curing layer 270 facing away from the bottom metal layer 230 is flatter, and the flatness of the binding area of the double-row gold fingers and the binding yield are improved.

Figure 12:
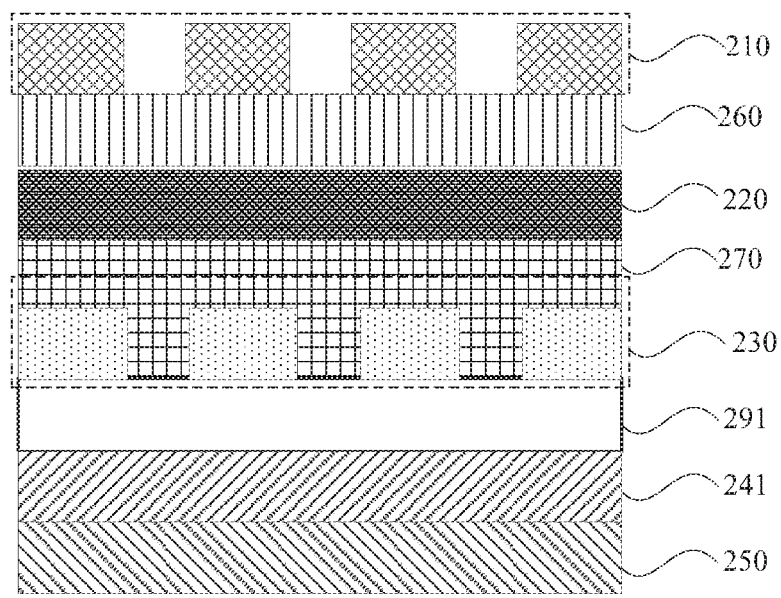
FIG. 12 is a cross-sectional view taken along AA' of another FPC according to an embodiment of the present disclosure.

FIG. 12 is a cross-sectional view taken along AA' of another FPC according to an embodiment of the present disclosure. As shown in FIG. 12, in the FPC 200, a side of a metal layer including the first connection line 130 facing away from the second row 120 of gold fingers is located on a supporting film 291.

Two opposite sides of the base material layer 260 are respectively provided with the top metal layer 210, the intermediate metal layer 220. The supporting film 291 is provided with the bottom metal layer 230, and the bottom metal layer 230 includes the first connection line 130. The supporting film 291 may be made of a PI material and functions to support the bottom metal layer 230. A side of the intermediate metal layer 220 facing away from the top metal layer 210 is coated with one hot-pressing curing layer 270, and the bottom metal layer 230 with the supporting film 291 and the intermediate layer 220 are aligned and hot-pressed. The hot-pressing curing layer 270 is filled in the gap in the first connection line 130, and after the hot-pressing curing layer 270 is cured, a hard support bar is formed in the gap in the first connection line 130, so that a side surface of the supporting film 291 facing away from the intermediate metal layer 220 is flat and even, and the flatness of the binding area of the double-row gold fingers and the binding yield are improved.

What is claimed is:

1. A flexible printed circuit (FPC), comprising:
a first row of gold fingers and a second row of gold fingers, wherein the first row and the second row are disposed on a same layer, the first row of gold fingers comprises a plurality of first gold fingers extending in a first direction and arranged in a second direction, and the second row of gold fingers comprises a plurality of second gold fingers extending in the first direction and arranged in the second direction; and
a plurality of first connection lines, disposed in a different layer from the second row of gold fingers;
wherein the plurality of first connection lines is electrically connected to the plurality of first gold fingers, and the plurality of first connection lines is insulated from the plurality of second gold fingers and extends to an area where the second row of gold fingers is located;
wherein each of the plurality of first connection lines comprises a first wire and a second wire, and a line width of the first wire is greater than a line width of the second wire;
wherein the first wire comprises a first portion, a second portion and a third portion connected in sequence along the first direction, the second portion overlaps with the area where the second row of gold fingers is located, and the second portion comprises a plurality of sub-wires connected in parallel and extending in the first direction; and
wherein a line spacing between adjacent sub-wires in the second portion is equal to a line spacing between adjacent first connection lines.

2. The FPC of claim 1, wherein the first wire comprises:
at least one of a ground line, a positive power signal line or a negative power signal line.

3. The FPC of claim 1, wherein a total resistance per unit length of the plurality of sub-wires in the second portion is equal to a resistance per unit length of the first portion; and
the resistance per unit length of the first portion is equal to a resistance per unit length of the third portion.

4. The FPC of claim 1, wherein in an extending direction perpendicular to the first connection line, a width of the first portion, a width of the second portion and a width of the third portion are equal; and a thickness of the second portion is greater than a thickness of the first portion, and the thickness of the first portion is equal to a thickness of the third portion.

5. The FPC of claim 1, wherein a line width of the sub-wire is equal to the line width of the second wire.

6. The FPC of claim 1, further comprising:
a top metal layer, at least one intermediate metal layer and a bottom metal layer;
wherein the top metal layer is insulated from the intermediate metal layer adjacent to the top metal layer, two adjacent intermediate metal layers are insulated, and the bottom metal layer is insulated from the intermediate metal layer adjacent to the bottom metal layer;
wherein a side of the bottom metal layer facing away from the intermediate metal layer is provided with a first adhesive layer, and a side of the first adhesive layer facing away from the bottom metal layer is provided with a covering protective layer;
wherein the top metal layer comprises the first row of gold fingers and the second row of gold fingers; and
wherein at least one of the intermediate metal layer or the bottom metal layer comprises the first connection line.

7. The FPC of claim 6, wherein an intermediate metal layer comprising the first connection line is an intermediate circuit layer, another intermediate metal layer is an intermediate shielding layer, and the intermediate shielding layer is a whole-surface metal layer;
the intermediate shielding layer is located at least one of: between the top metal layer and the intermediate circuit layer, between adjacent intermediate circuit layers, or between the intermediate circuit layer and the bottom metal layer;

a base material layer is provided between the top metal layer and the intermediate metal layer adjacent to the top metal layer; and a hot-pressing curing layer is provided between the adjacent intermediate metal layers, and between the bottom metal layer and the intermediate metal layer adjacent to the bottom metal layer.

8. The FPC of claim 6, wherein the top metal layer comprises a plurality of second connection lines; at least part of the plurality of second connection lines are electrically connected to the second gold fingers, and the first gold fingers are electrically connected to the first connection lines through a via hole.

9. The FPC of claim 6, wherein a side of the covering protective layer facing away from the bottom metal layer is provided with an ink layer.

10. The FPC of claim 6, wherein a side surface of a metal layer comprising the first connection line facing away from the second row of gold fingers is provided with an ink layer, and the ink layer is filled in a gap between adjacent first connection lines.

11. The FPC of claim 10, wherein a thickness of the second portion is T1, and a thickness of the ink layer is T2, and T2≥(T1+10) um.

12. The FPC of claim 6, wherein a side of the covering protective layer facing away from the bottom metal layer is provided with a second adhesive layer; and a side of the second adhesive layer facing away from the bottom metal layer is provided with a supporting film.

13. The FPC of claim 6, wherein a side surface of a metal layer comprising the first connection line facing away from the second row of gold fingers is provided with a hot-pressing curing layer, and the hot-pressing curing layer is filled in a gap between adjacent first connection lines.

14. The FPC of claim 6, wherein a side of a metal layer comprising the first connection line facing away from the second row of gold fingers is located on a supporting film.

* * * * *